(12) United States Patent
Uesugi et al.

(10) Patent No.: US 7,465,662 B2
(45) Date of Patent: Dec. 16, 2008

(54) METHOD OF MAKING SEMICONDUCTOR DEVICE

(75) Inventors: Katsuhiro Uesugi, Tokyo (JP); Katsuo Katayama, Tokyo (JP); Katsuhisa Sakai, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/907,438

(22) Filed: Oct. 12, 2007

(65) Prior Publication Data

US 2008/0045006 A1    Feb. 21, 2008

Related U.S. Application Data

(62) Division of application No. 11/229,550, filed on Sep. 20, 2005, now Pat. No. 7,301,237.

(30) Foreign Application Priority Data

Sep. 22, 2004    (JP)    ............... 2004-275565

(51) Int. Cl.
*H01L 21/44*    (2006.01)

(52) U.S. Cl. ............... 438/672; 438/637; 438/675; 438/620; 438/E21.577

(58) Field of Classification Search ......... 438/637–638, 438/672–673, 618–624, 118–124

See application file for complete search history.

(56) References Cited

U.S. PATENT DOCUMENTS

| | | | |
|---|---|---|---|
| 5,976,984 A | 11/1999 | Chen et al. | |
| 2003/0148618 A1* | 8/2003 | Parikh | ............... 438/694 |
| 2004/0065957 A1 | 4/2004 | Maekawa et al. | |

FOREIGN PATENT DOCUMENTS

| | | |
|---|---|---|
| JP | 05-299515 | 11/1993 |
| JP | 09-007970 | 1/1997 |
| JP | 2000-294631 | 10/2000 |

\* cited by examiner

*Primary Examiner*—Dung A. Le
(74) *Attorney, Agent, or Firm*—McDermott Will & Emery LLP

(57) ABSTRACT

A semiconductor device is manufactured by a method including forming a first interlayer insulating film. A first etching stopper film is formed on the first interlayer insulating film. A conductive layer is formed on the first etching stopper film. A second etching stopper film is formed to cover the conductive layer, an upper surface of the conductive layer and both side surfaces of the conductive layer. A second interlayer insulating film is formed on the second etching stopper film. A hole is formed penetrating the second interlayer insulating film in a direction of thickness and reaching the conductive layer. An interconnect is formed in the hole. The step of forming a hole includes etching the second interlayer insulating film under a first etching condition, and etching the second etching stopper film under a second etching condition different from the first etching condition.

2 Claims, 4 Drawing Sheets

METHOD OF MAKING SEMICONDUCTOR DEVICE

RELATED APPLICATIONS

This application is a Divisional of U.S. application Ser. No. 11/229,550, filed Sep. 20, 2005, now U.S. Pat. No. 7,301,237 claiming priority of Japanese Application No. 2004-275565, filed Sep. 22, 2004, the entire contents of each of which are hereby incorporated by reference.

BACKGROUND OF THE INVENTION

1. Field of the Invention

The present invention relates to a semiconductor device having an interconnection connected to a conductive layer present above a semiconductor substrate as well as to a manufacturing method thereof 2. Description of the Background Art Conventionally, a method of manufacturing a semiconductor device including the step of forming a hole penetrating a second interlayer insulating film covering a conductive layer formed on a first interlayer insulating film and reaching the conductive layer has been employed. In the method of manufacturing a semiconductor device, if a position at which the hole is formed is displaced from a position of the conductive layer, the hole reaches the first interlayer insulating film under the conductive layer. Such penetration caused by misalignment of the hole is more likely in a recent semiconductor device that has been reduced in size.

As a technique to prevent the hole from penetrating as far as the first insulating film under the conductive layer due to misalignment of the hole as described above, Japanese Patent Laying-Open No. 05-299515 discloses a technique to provide an etching stopper film solely on a sidewall of the conductive layer. In addition, Japanese Patent Laying-Open No. 2000-294631 discloses a technique to provide double etching stopper film in a damascene structure. Moreover, Japanese Patent Laying-Open No. 09-007970 discloses a technique to provide an etching stopper film only on a lower side of the conductive layer.

None of the techniques described above, however, can completely solve the problem of the hole reaching the first interlayer insulating film.

SUMMARY OF THE INVENTION

An object of the present invention is to provide a semiconductor device in which a hole reaching a conductive layer is prevented from reaching an interlayer insulating film provided under the conductive layer as well as a manufacturing method thereof.

A semiconductor device according to the present invention includes a first interlayer insulating film, a first etching stopper film formed on the first interlayer insulating film, a conductive layer formed on the first etching stopper film, and a second etching stopper film formed at least on the first etching stopper film. In addition, the semiconductor device includes a second interlayer insulating film formed to cover the second etching stopper film and the conductive layer, and an interconnection formed to penetrate the second interlayer insulating film in a direction of thickness and to come in contact with the conductive layer.

According to the semiconductor device described above, a sandwich structure in which the conductive layer is sandwiched by the first etching stopper film and the second etching stopper film is formed. Therefore, when a method of manufacturing a semiconductor device which will be described later is employed, a hole reaching a first insulating layer, i.e., what is called hole penetration, can be prevented in forming the hole in which an interconnection is embedded.

A method of manufacturing a semiconductor device according to the present invention includes the steps of forming a first interlayer insulating film, forming a first etching stopper film on the first interlayer insulating film, and forming a conductive layer on the first etching stopper film. In addition, the method of manufacturing a semiconductor device includes the steps of forming a second etching stopper film to cover the first etching stopper film and the conductive layer, forming a second interlayer insulating film on the second etching stopper film, forming a hole penetrating the second interlayer insulating film in a direction of thickness and reaching the conductive layer, and forming an interconnection in the hole. The step of forming a hole includes the steps of etching the second interlayer insulating film under a first etching condition, and etching the second etching stopper film under a second etching condition different from the first etching condition.

Each of the first etching stopper film and the second etching stopper film described above may include any one of a silicon nitride film and a silicon rich oxide (SRO) film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A semiconductor device and a manufacturing method thereof according to an embodiment of the present invention will be described hereinafter with reference to the drawings. Initially, a structure of the semiconductor device according to the embodiment of the present invention will be described with reference to FIG. 1.

Figure 1:
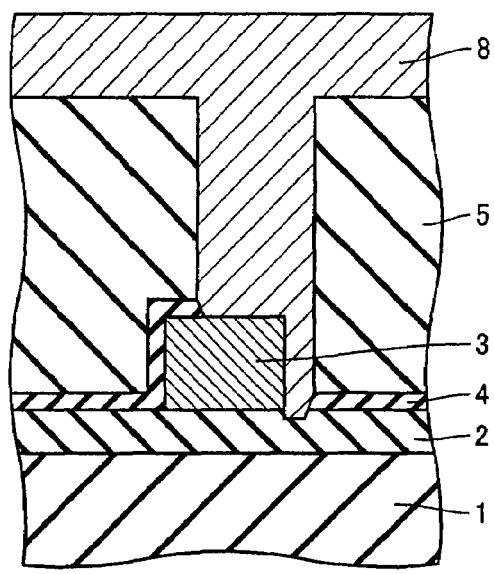
FIG. 1 is a diagram for illustrating a structure of a semiconductor device according to an embodiment.

As shown in FIG. 1, the semiconductor device according to the present embodiment includes an interlayer insulating film 1 provided above a semiconductor substrate. An etching stopper film 2 is formed on interlayer insulating film 1. In addition, a conductive layer 3 is formed on etching stopper film 2. An etching stopper film 4 is formed to cover an upper surface of etching stopper film 2, one side surface of conductive layer 3, and a part of an upper surface of conductive layer 3. Furthermore, an interlayer insulating film 5 is formed to cover etching stopper film 4. An interconnection 8 penetrating interlayer insulating film 5 in a direction of thickness and reaching conductive layer 3 is formed.

According to the structure as above, when a hole in which interconnection 8 is embedded is formed, the hole does not reach interlayer insulating film 1, although etching stopper film 2 is partially etched. Consequently, reliability of the semiconductor device is improved.

A method of manufacturing the semiconductor device shown in FIG. 1 will be described with reference to FIGS. 2 to 6.

Figure 2:
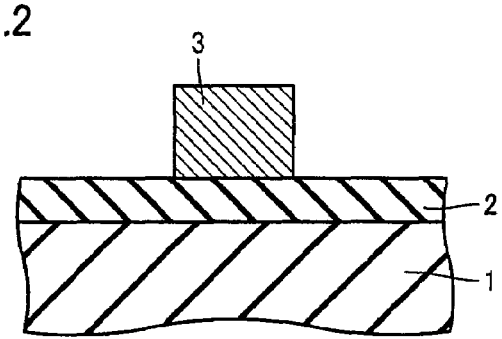
FIGS. 2 to 6 are diagrams illustrating a method of manufacturing a semiconductor device according to the embodiment.

Initially, interlayer insulating film 1 is formed above the semiconductor substrate. Then, etching stopper film 2 is formed on interlayer insulating film 1. Thereafter, conductive layer 3 is formed on etching stopper film 2. The structure shown in FIG. 2 is thus obtained.

Figure 3:
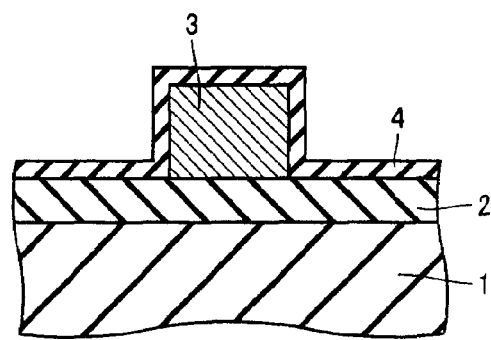
Figure 4:
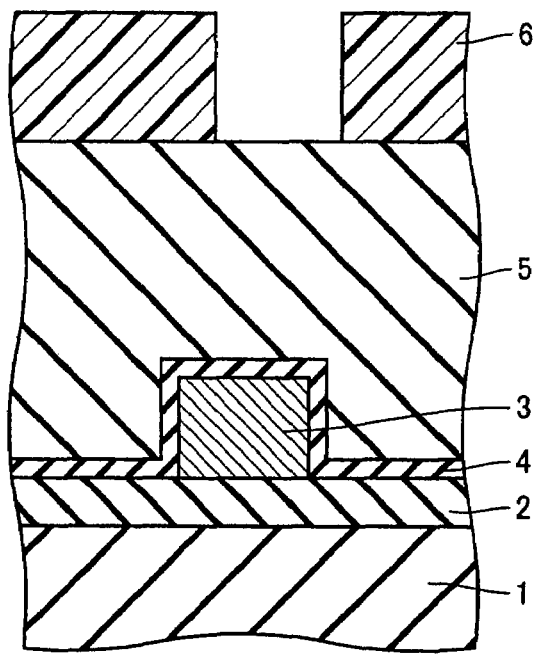

As shown in FIG. 3, etching stopper film 4 is formed to cover etching stopper film 2 and the upper surface and opposing side surfaces of conductive layer 3. Then, interlayer insulating film 5 is formed to cover etching stopper film 4. Thereafter, a resist film 6 that has been patterned to form a hole reaching conductive layer 3 is formed. The structure shown in FIG. 4 is thus obtained.

Figure 5:
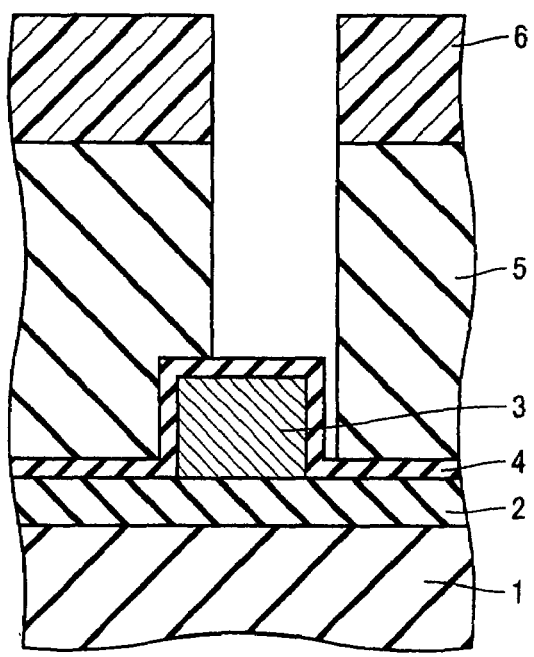
Figure 6:
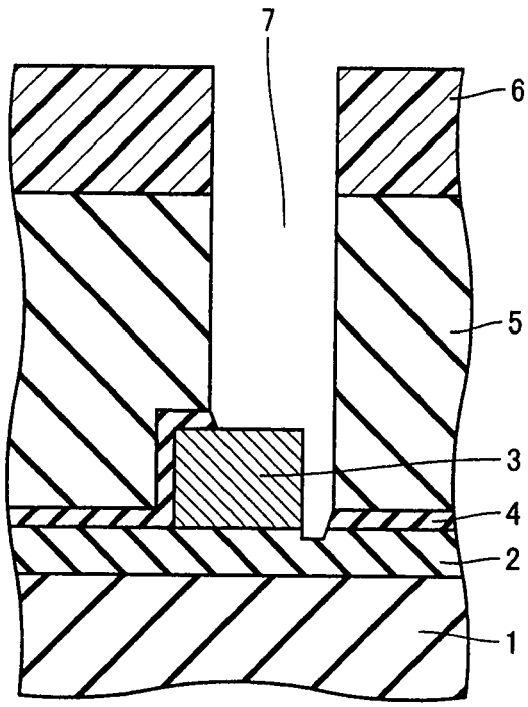

Then, as shown in FIG. 5, using resist film 6 as an etching mask, interlayer insulating film 5 is etched to expose etching stopper film 4. Then, etching stopper film 4 is etched under an etching condition different from that for etching interlayer insulating film 5. As shown in FIG. 6, a hole 7 reaching conductive layer 3 is thus formed. Conductive layer 3 is exposed on a bottom surface of hole 7.

Here, consider a case in which hole 7 is displaced from a position of conductive layer 3 and etching stopper film 4 is removed to expose one of opposing side surfaces of conductive layer 3, as shown in FIG. 6. Even in such a case, as etching stopper film 2 is provided under etching stopper film 4, the bottom surface of hole 7 does not reach interlayer insulating film 1, although the bottom surface of hole 7 penetrates etching stopper film 4 and reaches etching stopper film 2.

According to the method of manufacturing a semiconductor device according to the present embodiment as above, in a state where two etching stopper films sandwiching conductive layer 3 from above and below are provided, interlayer insulating film 5 present above conductive layer 3 is initially etched. Thereafter, etching stopper film 4 present on conductive layer 3 is removed. Therefore, such a disadvantage as hole 7 reaching interlayer insulating film 1 is prevented. Consequently, reliability of the semiconductor device is improved.

Here, etching stopper film 2 has a film thickness of approximately 20 nm to 200 nm. Conductive layer 3 is implemented by a film consisting of tungsten, aluminum or the like and has a thickness of approximately 200 nm. Meanwhile, etching stopper film 4 has a film thickness of 50 nm. Etching of interlayer insulating film 5 described above is carried out by dry etching such as RIE (Reactive Ion Etching). Desirably, an Si-rich insulating film having a composition ratio of O/Si of approximately 1.2, that is, an SRO (Silicon Rich Oxide) film, is employed as etching stopper films 2 and 4. Alternatively, etching stopper films 2 and 4 may be implemented by a silicon nitride film.

A gas obtained by adding at least any one of $O_2$ and CO or Ar to a gas such as $C_4F_8$, $C_5F_8$, $C_4F_6$, $C_2F_4$, or $C_3F_6$ representing a CF-based gas containing C and F is basically employed as an etching gas for the first etching condition of the present invention. As shown in FIG. 5, with the use of this gas, interlayer insulating film 5 (silicon oxide film) is initially etched. The etching gas described above is merely an example of gases that can selectively etch interlayer insulating film 5 with respect to etching stopper film 4, and the gas for etching interlayer insulating film 5 is not limited to those described above.

In addition, a gas obtained by adding at least any one of $O_2$ and CO or Ar to a gas such as $CHF_3$ or $CH_2F_2$ containing C, F and H is employed as an etching gas for the second etching condition of the present invention. As shown in FIG. 6, with the use of this gas, exposed etching stopper film 4 is etched. Consequently, conductive layer 3 is exposed on the bottom surface of hole 7. The etching gas described above is merely an example of gases for efficient etching of etching stopper film 4, and the etching gas for etching stopper film 4 is not limited to those described above.

Figure 7:
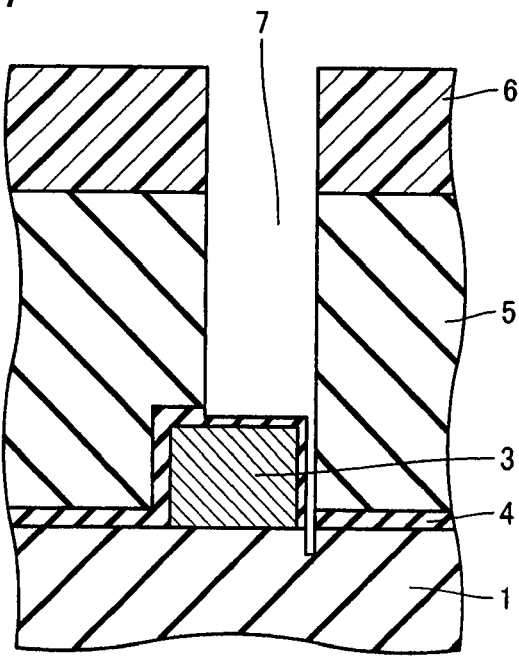
FIGS. 7 and 8 are diagrams illustrating a method of manufacturing a semiconductor device according to a comparative example.
Figure 8:
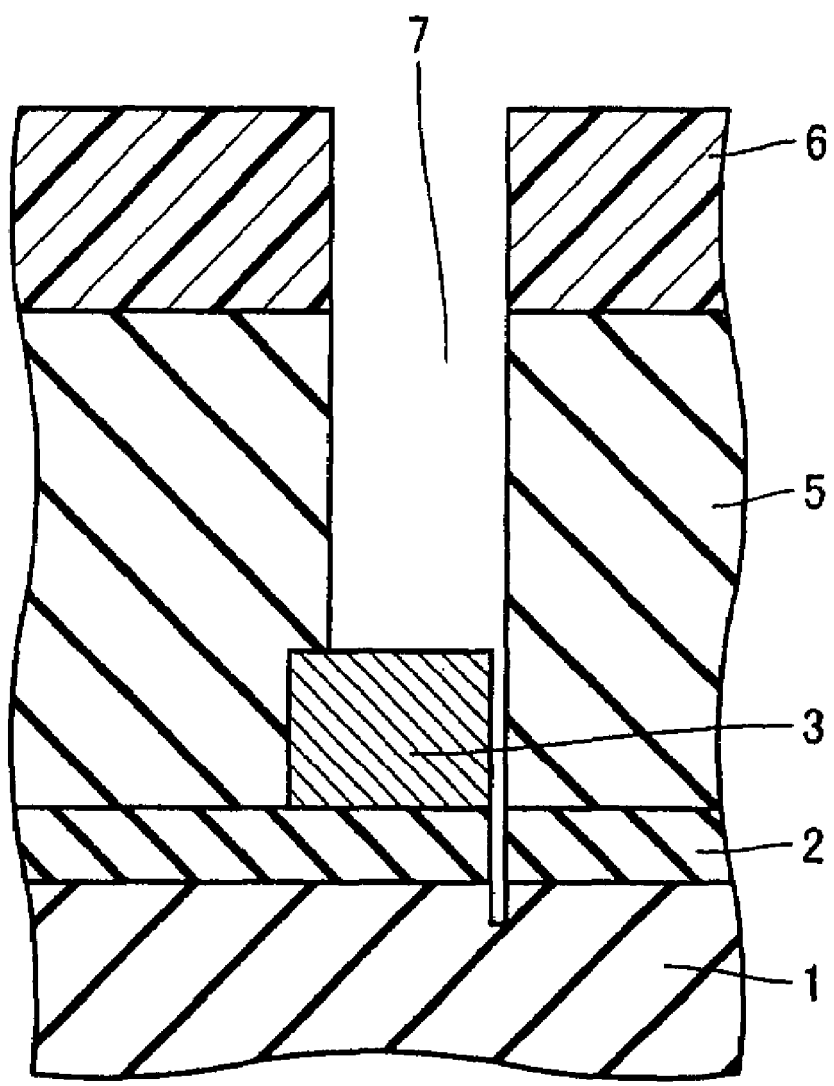

Semiconductor devices structured as shown in FIGS. 7 and 8 are considered as comparative examples of the semiconductor device structured according to the embodiment of the present invention as above.

In FIG. 7, etching stopper film 4 on conductive layer 3 is provided, however, etching stopper film 2 under conductive layer 3 is not provided. With such a structure, after interlayer insulating film 5 is etched, etching stopper film 4 should be etched under a different etching condition, so as to expose conductive layer 3. Here, if a position at which hole 7 is formed is displaced from an end portion of conductive layer 3, the bottom surface of hole 7 penetrates etching stopper film 4, to reach interlayer insulating film 1.

In FIG. 8, etching stopper film 2 under conductive layer 3 is provided, however, etching stopper film 4 on conductive layer 3 is not provided. With such a structure, when interlayer insulating film 5 is etched to expose conductive layer 3, it is difficult to stop etching at the timing of exposure of conductive layer 3, because a distance in a direction of thickness of interlayer insulating film 5 is great. Accordingly, particularly if a position at which hole 7 is formed is displaced from an end portion of conductive layer 3 by a small amount of not larger than 20 nm, the bottom surface of hole 7 penetrates etching stopper film 2, to reach interlayer insulating film 1.

As can been seen from comparison between the structure according to the comparative examples in FIGS. 7 and 8 and the structure according to the present embodiment shown in FIGS. 1 to 6, penetration of hole 7 as far as interlayer insulating film 1 can effectively be prevented by providing etching stopper films 2 and 4 sandwiching conductive layer 3 from above and from below.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:
   forming a first interlayer insulating film;
   forming a first etching stopper film on said first interlayer insulating film;
   forming a conductive layer on said first etching stopper film;
   forming a second etching stopper film to cover said first etching stopper film, an upper surface of said conductive layer and both side surfaces of said conductive layer;
   forming a second interlayer insulating film on said second etching stopper film;
   forming a hole penetrating said second interlayer insulating film in a direction of thickness and reaching said conductive layer; and
   forming an interconnection in said hole; wherein
   said step of forming a hole includes the steps of
   etching said second interlayer insulating film under a first etching condition, and
   etching said second etching stopper film under a second etching condition different from said first etching condition.

2. The method of manufacturing a semiconductor device according to claim 1, wherein
   each of said first etching stopper film and said second etching stopper film includes any one of a silicon nitride film and a silicon rich oxide (SRO) film.

* * * * *